US005574863A

United States Patent [19]

Nelson et al.

[11] Patent Number: 5,574,863
[45] Date of Patent: Nov. 12, 1996

[54] SYSTEM FOR USING MIRRORED MEMORY AS A ROBUST COMMUNICATION PATH BETWEEN DUAL DISK STORAGE CONTROLLERS

[75] Inventors: Marvin D. Nelson; Douglas L. Voigt; Randy J. Matthews, all of Boise, Id.

[73] Assignee: Hewlett-Packard Company, Palo Alto, Calif.

[21] Appl. No.: 329,004

[22] Filed: Oct. 25, 1994

[51] Int. Cl.$^6$ .................................................. G06F 15/167
[52] U.S. Cl. .................. 395/200.08; 395/474; 395/479; 395/600; 395/700; 395/601; 395/561; 364/DIG. 1; 364/228.1; 364/236.2; 364/241.7; 364/243; 364/243.7; 364/246.8; 364/248.1
[58] Field of Search ................. 395/200.07, 200.08, 395/200.12, 200.14, 200.19, 474–480, 488–489, 600, 700, 800, 200.13

[56] References Cited

U.S. PATENT DOCUMENTS

| | | | |
|---|---|---|---|
| 4,368,514 | 1/1983 | Persavo et al. | 395/200.05 |
| 4,400,775 | 8/1983 | Nozaki et al. | 395/200.08 |
| 4,404,628 | 9/1983 | Angelo | 395/200.08 |
| 4,543,627 | 9/1985 | Schwab | 395/200.02 |
| 4,862,354 | 8/1989 | Fiacconi et al. | 395/200.06 |
| 4,991,079 | 2/1991 | Dann | 395/200.08 |
| 4,999,768 | 3/1991 | Hirokawa | 395/200.07 |
| 5,142,683 | 8/1992 | Burkhardt, Jr. et al. | 395/733 |
| 5,155,807 | 10/1992 | Blevins et al. | 395/200.01 |
| 5,155,835 | 10/1992 | Belsan | 395/441 |
| 5,195,100 | 3/1993 | Katz et al. | 371/66 |
| 5,237,658 | 8/1993 | Walker et al. | 395/858 |
| 5,278,838 | 1/1994 | Ng et al. | 371/10.1 |
| 5,287,462 | 2/1994 | Jibbe et al. | 395/856 |
| 5,289,418 | 2/1994 | Youngerth | 365/201 |
| 5,297,258 | 3/1994 | Hale et al. | 395/441 |
| 5,454,095 | 9/1995 | Kraemer et al. | 364/431.05 |

OTHER PUBLICATIONS

Stallings, W. Data and Computer Communications, N.Y. MacMillan, 1988, p. 141.

*Primary Examiner*—Lance Leonard Barry
*Attorney, Agent, or Firm*—Lane R. Simmons

[57] ABSTRACT

In a disk storage system having dual controllers and mirrored memory therebetween, the mirrored memory is used to establish a robust communication path between the controllers to monitor and coordinate their activities. A reserved portion of the memory in each controller is designated as a messaging mailbox which is read and written by the owning controller but only read by the remote controller. The communication protocol between the controllers is tightly coupled to insure proper messaging. Furthermore, a sliding window interlock insures message detection and correctness. In addition, interrupt signals and timer based polling are used as a dual means for detecting communication requests and replies between the controllers.

17 Claims, 3 Drawing Sheets

FIG. 2

| NO. | CONTROL MESSAGE | REPLY MESSAGE |
|---|---|---|
| 1. | ARE-YOU-ACTIVE (SLAVE TO MASTER) | YES-ACTIVE/NO-INACTIVE |
| 2. | TIMEOUT-I'M-BECOMING-MASTER (SLAVE TO MASTER) | OK-BECOMING-SLAVE |
| 3. | BROKEN-PLEASE-REPORT (SLAVE TO MASTER) | OK-REPORTING-BROKEN |
| 4. | TAKEOVER (MASTER TO SLAVE) | OK-TAKING-OVER |
| 5. | COMM-FAILURE | ACKNOWLEDGE-COMM-FAILURE |
| 6. | PLEASE-RESET | OK-RESETTING |
| 7. | UPDATE-TO-VALID-SLAVE | UPDATED-TO-VALID-SLAVE |
| 8. | NO-MESSAGE | NO-REPLY |

SYSTEM FOR USING MIRRORED MEMORY AS A ROBUST COMMUNICATION PATH BETWEEN DUAL DISK STORAGE CONTROLLERS

FIELD OF THE INVENTION

This invention relates in general to computer disk storage controllers and, more particularly, to a communication and control system for mirrored memory controllers in a dual controller disk storage system.

BACKGROUND OF THE INVENTION

In high reliability computer disk storage systems, there is a desire to have redundancy in all the physical parts which make up a subsystem to reduce the potential for loss of data and down time upon failure of a part. The use of dual disk storage controllers, each having its own memory, provides several major benefits to a disk storage system. For example, (1) a redundancy of storage information is retained to allow for recovery in the case of failure or loss of one controller or its memory; (2) repair of a disabled controller is feasible due to the failover capabilities of the secondary controller; and (3) greater system up time is achieved through the secondary controller being available.

With the desire for more performance out of these redundant subsystems, caching and the use of memory as temporary storage has become commonplace. The means by which these duplicate physical memories are kept in synchronization can be difficult. Some disk systems use a latent (delayed or massive update) process to create this duplication, but that approach tends to add expense, is very complex to manage, reduces performance, and limits the accuracy of recovery from failures. Another approach (the one used in this invention) is to form a real-time mirrored memory process to create and retain accuracy during the process of duplication of data. The use of real time, synchronized, redundant memory (mirrored memory) in dual controllers can improve speed and accuracy in the case of a failover from one controller to the other.

Given that mirrored memory is used as the underlying duplication process, one could further control additional costs required for communication by forming a communication path inside that mirrored memory. However, this use of redundant memory as a communication path brings with it a wealth of problems in making that communication path robust. The wealth of problems to overcome include: (1) how are the redundant memories kept consistent and the communication working in light of hardware anomalies; (2) how are address decoding or data bit problems between the memories resolved; (3) how are messages synchronized between the controllers; (4) how are redundant copies of the memory protected from unintentional corruptions created by the communication process between the controllers; (5) how is the consistency of mirrored or shared memory managed; (6) how is a communication process error or total communication break down managed; and (7) when hardware failures are known, what processes are appropriate and how can such be safely communicated to the other controllers.

Given the foregoing problems, and the potential for total loss of communication between controllers should one controller fail, it is not generally taught in the prior art to use mirrored memory as a communication and control path between controllers in a multiple controller system. Rather, prior art methods and channels of communication include small computer systems interface (SCSI), RS232 links, local area networks (LANs), or the like.

Accordingly, objects of the present invention are to provide a communication and control system for real-time, synchronous, mirrored memory controllers in a dual controller disk storage system and to provide a method for using such mirrored memory as a robust communication path between the controllers.

SUMMARY OF THE INVENTION

According to principles of the present invention in its preferred embodiment, in a disk storage system having dual controllers and mirrored memory therebetween, the mirrored memory is used to establish a robust communication path between the controllers to monitor and coordinate their activities. A reserved portion of the memory in each controller is designated as a messaging mailbox which is read and written by the owning controller but only read by the remote controller to avoid improper activity and corruption in the mailbox and the rest of memory.

According to further principles of the present invention, a communication protocol between the controllers is tightly coupled to insure proper messaging. Each request from a controller has a specific and unambiguous reply, thereby allowing a receiver of the reply to validate that an answer is indeed the answer to a previously submitted request. Furthermore, a sliding window interlock identification number insures message detection and correctness.

According to further principles of the present invention, interrupt signals and timer based polling are used as a dual means for detecting communication requests and replies between the controllers. Moreover, Standard Operating Procedures (SOPs) are used to recover from total communication breakdown between the controllers.

Other objects, advantages, and capabilities of the present invention will become more apparent as the description proceeds.

DESCRIPTION OF THE DRAWINGS

FIG. 2 is a table depicting messages representative of the tightly coupled communication protocol embodied in the present invention.

DETAILED DESCRIPTION OF THE INVENTION

Figure 1:
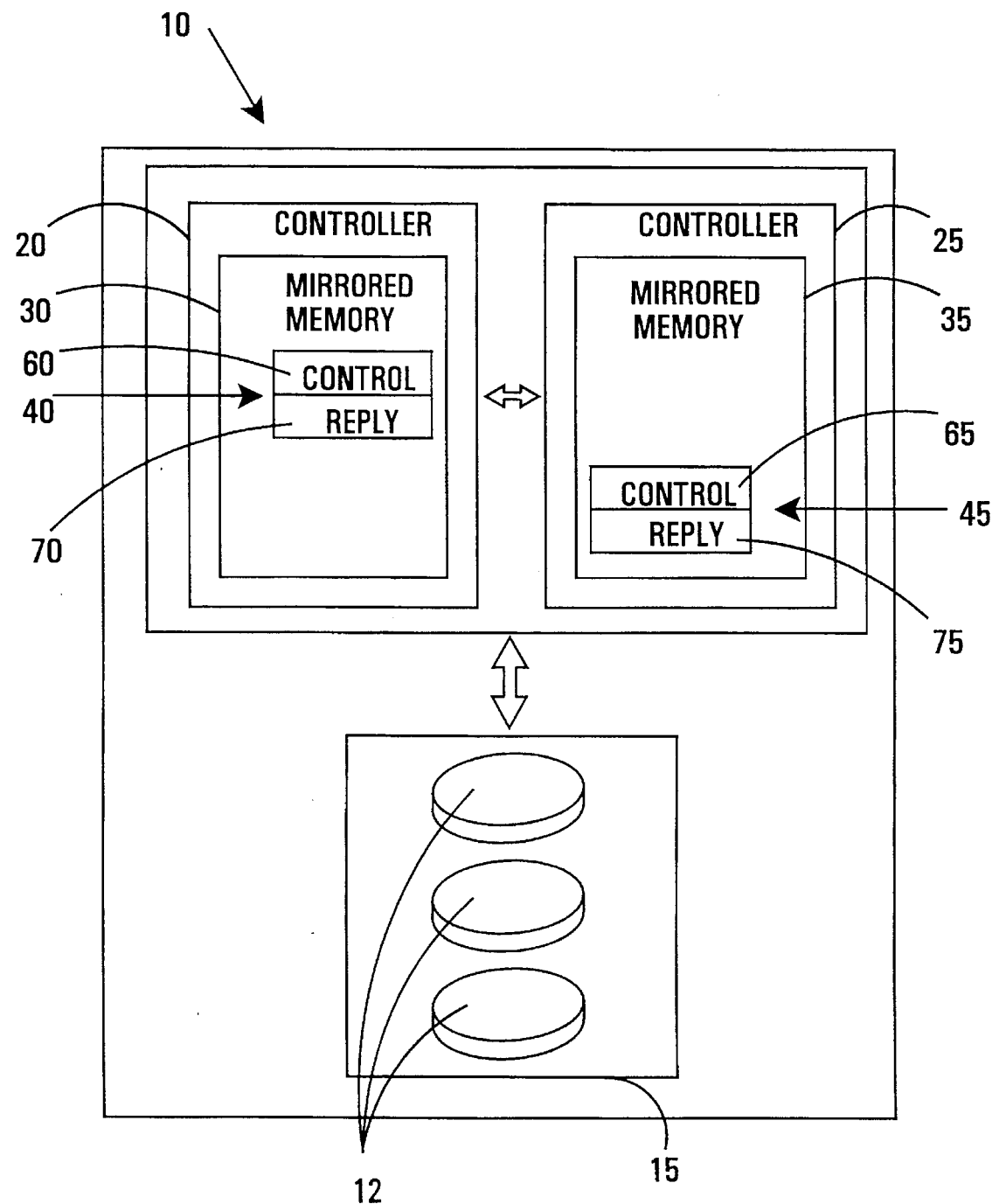
FIG. 1 is a block diagram representing an overview of the present invention system for using mirrored memory as a communication path between dual disk storage controllers.

FIG. 1 is a block diagram representing an overview of the present invention system for using mirrored memory as a robust communication path between dual disk storage controllers. A disk storage system is depicted generally at 10, having disk storage devices 12 depicted generally at 15 and dual disk storage controllers depicted generally at 20 and 25. Controllers 20 and 25 each have memory 30 and 35, respectively.

Although most any type of Random Access Memory (RAM) is suitable for use as memory 30 and 35, in the preferred embodiment a non-volatile RAM (or volatile RAM made non-volatile by use of a power supply backup)

is used to allow for retention of data in the event of a power failure. Moreover, although only dual controllers 20 and 25 are shown in the diagram and discussed generally herein, it will be obvious that the teachings expressed and implied herein are likewise applicable in a multiple controller environment, i.e., more than two controllers.

Each memory 30 and 35 is a mirrored memory. As is well known in the art, mirrored memory simply means that data in one memory is duplicated or "mirrored" in another memory. As used in the present invention, mirrored memory means that data in the memory of one controller is duplicated or "mirrored" in the memory of the other controller. In the preferred embodiment, the mirrored memory is a real-time mirrored memory, i.e., a single microprocessor or direct memory access updates data into or retrieves data from both memories 30 and 35 at substantially the same time.

The existence of dual controllers, and mirrored memory in each, provides a fault tolerant environment for disk storage system 10. In each mirrored memory 30 and 35, a reserved portion 40 and 45 is designated generally as a messaging mailbox. Mailboxes 40 and 45 are used as an underlying communication and control means to monitor and coordinate activities between the controllers.

Mailboxes 40 and 45 constitute essential building blocks of the present invention. Through each mailbox, communication occurs between controllers 20 and 25 to provide a robust communication path therebetween, to provide a cost effective real-time link, and to allow each controller to monitor the state of the duplicate controller and to coordinate activities. Communication works by a controller writing a message to its own mailbox and then the other controller reading the message out of that same mailbox.

Since the communication path established between the mailboxes is a critical component, all precautions must be taken to retain communication integrity therebetween. Accordingly, in order to avoid damage to the communication process itself, and to avoid collateral damage to a controller's memory when communicating through the mailboxes (i.e., in order to retain data integrity in the event of some failure), each mailbox 40 and 45 is read and written by the controller on which the mailbox resides but only read by the other controller. For example, controller 20 reads and writes its own mailbox 40, and only reads the other mailbox 45. Likewise, controller 25 reads and writes its own mailbox 45, and only reads the other mailbox 40. Although memory 30 and 35 is generally mirrored memory, mirroring is selectively controlled (disabled) during writing of reserved mailbox portions 40 and 45 to effectuate communication therebetween and to avoid unintentional collateral damage to the other controller's memory. During reading of the other (remote) mailbox, the mirroring process is likewise selectively controlled such that only the remote data is read.

For clarification, mailboxes 40 and 45 make up a full duplex communication path. Specifically, requests made in mailbox 40, control part 60, are replied to in mailbox 45, reply part 75. Additionally, requests made in mailbox 45, control part 65, are replied to in mailbox 40, reply part 70.

Each mailbox 40 and 45 actually comprises at least two separate mailbox parts in the preferred embodiment: one control mailbox 60 and 65 for holding and communicating a control message, and one reply mailbox 70 and 75 for holding and communicating a reply message. The control message is a specific request (or inquiry) intended for the other controller, whereas the reply message is a specific response to a request or inquiry. Also, although not shown in the drawing, for the purpose of simplicity in using general purpose mirrored memory there are addresses in each memory corresponding to control and reply mailboxes that are unused.

Communication of messages between the controllers occurs only through a tightly coupled communication protocol to insure proper messaging. Namely, for each message there is a specific, unambiguous, and unique response (reply) to a specific, unambiguous, and unique request (inquiry). This allows a receiver of a reply (i.e., an initiator of a request or inquiry) to validate that a reply is indeed the answer to his specific request. See FIG. 2 for further details on the tightly coupled communication protocol.

Further contributing to the robust communication path between controllers 20 and 25, a sliding window interlock scheme is used in association with any message written into mailboxes 40 and 45. As is known in the art, and in context of this invention, a sliding window interlock scheme includes the use of an identification number with each message to further insure message detection and one-to-one message correctness. For example, when a requesting controller writes a request message into its control mailbox, a sliding window interlock identification number is written also. When the other reply controller reads the message, it reads the identification number also. Consequently, when the reply controller writes a reply message to its own reply mailbox in response to the request message, it includes the same identification number with the reply. When the requesting controller reads the reply message, it also reads the identification number to make sure it is the same number as originally sent with the request message, and thus the requesting controller is able to detect and be sure that the reply is in fact an intended reply to its original request.

To further expound on the means of communication and detection of messages in the present invention, and for simplicity purposes, the use of the term "requesting controller" shall mean a controller that writes a message into its own control mailbox, and subsequently reads a reply message from the other controller's reply mailbox. The use of the term "reply controller" shall mean a controller that reads a message from the control mailbox of the other controller, and subsequently writes a reply message to its own reply mailbox.

After a requesting controller writes a message into its own mailbox, it immediately communicates to the reply controller that a message exists in the requesting controller's mailbox for the reply controller to read. The requesting controller communicates this by generating an interrupt signal to the reply controller. The interrupt signal is generated by hardware and/or software as is commonly known in the art.

A reply controller is able to detect that a message exists in a requesting controller's mailbox in two distinct ways, either of which may be used as a primary means of detection. On the one hand, a reply controller detects that a message exists by detecting the interrupt signal generated by the requesting controller which explicitly communicates to the reply controller that a message exists. On the other hand, the reply controller detects that a message exists by polling the requesting controller's mailbox on a timed interval basis, regardless of ever receiving the interrupt signal generated by the requesting controller. In the preferred embodiment, the timed interval is approximately 16 seconds. Each controller responds to its own clock upon the timed interval basis by polling the other controller's mailbox to detect whether a message exists. This dual method of detecting messages provides additional robustness and reliability of communication between the controllers in the case of failure of one method or the other.

As discussed, a controller is able to detect and read a message that has been written in the other controller's mailbox. This type of message is referred to as an "express" message. However, a controller may also detect and "read" an "implied" message that is not actually written in the other controller's mailbox. An "implied" message may be "read" from an interpretation of a set of circumstances relating to either controller. For example, assume a requesting controller sends a request message but never receives a reply message back from the other controller (this state being recognized upon detection of a timeout interval), or a reply message received was inappropriate or incorrect due to some communication problem associated with either of the controllers. In these instances, an "implied" communication has occurred. Namely, the requesting controller did not receive an "express" reply message back, but given the detection or recognition of not having received an express reply message, the requesting controller "reads" the circumstances, i.e., no reply message received, and initiates appropriate action accordingly.

Appropriate action is any predefined standard operating procedure (SOP) which the controllers are designated to follow. As an example, appropriate action may be for the requesting controller to enter into an isolation mode wherein memory is no longer mirrored between the controllers, and the requesting controller assumes control of the disk storage system on its own until a repair of the failure of communication occurs. It is understood that any number and variety of SOPs may be designated and followed in response to an implied or express message, and it is not the purpose here to define all those possibilities. It is the purpose here to only reflect the fact that some predefined action is taken by a controller in response to an express or an implied message detected.

As previously indicated, a reply controller reads the message contained in the requesting controller's control mailbox 60 or 65 upon detecting that a request message exists (via interrupt or polling). In response to the request, the reply controller then writes a specific reply to its own reply mailbox 70 or 75 and subsequently sends an interrupt signal back to the requesting controller following the same procedure that the requesting controller followed. The requesting controller then detects the message in the reply controller's reply mailbox via the interrupt or the timed interval poll previously described. Consequently, each controller takes appropriate action based on the request and reply messages. See FIG. 3 for further details of an example of this communication and hand shaking process.

Referring now to FIG. 2, a table depicting messages representative of the tightly coupled communication protocol embodied in the present invention is shown. The tightly coupled communication protocol is only one element of the present invention system and method for using mirrored memory as a robust communication path between dual controllers. This tightly coupled protocol demonstrates how for each message, a specific, unambiguous response to a specific, unambiguous request occurs to be sure communication is precise, understood, and known.

The messages are numbered in the table for ease of reference in this discussion only and do not relate to the messages in any way other than for this descriptive reference. It is understood that the messages shown are not intended to depict all the possible messages that may be used under the tightly coupled communication protocol of the present invention. Rather, these messages are merely representative of what is used in the preferred embodiment.

The term "message sent" will refer to the fact that a message has been written by a controller to its own mailbox (either control or reply mailbox, as appropriate, given the state of the communication occurring), even though it is understood that the message is not actually "sent" anywhere but, in fact, is merely read from the mailbox by the other controller as previously discussed herein. Also, the term "Master" refers to the controller that is presently operating on and responding to all host computer requests relative to the disk storage system, and the term "Slave" refers to the other controller.

FIG. 2 is representative of the messages that would most likely be used in a dual controller with a Master/Slave relationship. However, it is obvious that the principles of the present invention are equally applicable to other multiple controller relationships (i.e. Master/Master, etc.).

Message number 1, ARE-YOU-ACTIVE, is a message sent by the Slave controller to the Master as a heartbeat message (sent periodically) and used by the slave to detect when the master has failed. If the Master is still active and communicating, its only response is YES-ACTIVE, which indicates all is in order. On the other hand, if the Master recognizes that it is no longer serving as Master or is no longer able to serve as Master, its only response is NO-INACTIVE. Given either of these specific, unambiguous replies in response to the specific, unambiguous request, each controller knows exactly what action to take.

Message number 2, TIMEOUT-I'M-BECOMING-MASTER, is a message sent by the Slave when it detects that a timeout has occurred, i.e., the Master has not replied within a given time period (which is directly related to the rate of the timer based polling of messages). The only response the Master can reply with is OK-BECOMING-SLAVE, meaning the Slave will then become the Master. Alternatively, the Master may not be able to respond due to some failure, and the Slave becomes Master anyway in recognition of the failure to respond.

Message number 3, BROKEN-PLEASE-REPORT, is a message sent by the Slave to the Master when the Slave detects its own failure. The only response the Master can reply with is OK-REPORTING-BROKEN, meaning the Master reports the failure to the host computer.

Message number 4, TAKEOVER, is a message sent by the Master to the Slave when the Master wants the Slave to become the new Master. The only valid reply the Slave can respond with is OK-TAKING-OVER.

Message number 5, COMM-FAILURE, is a message sent by either controller to the other when some communication failure has been detected. The only valid reply is ACKNOWLEDGE-COMM-FAILURE.

Message number 6, PLEASE-RESET, is a message sent by either controller to the other when the other needs to be reset to correct some failure that has occurred. The only valid reply is OK-RESETTING.

Message number 7, UPDATE-TO-VALID-SLAVE, is a message sent by the Master to the Slave in order for the Slave to update its mirrored state variables. The only valid reply in this instance is UPDATED-TO-VALID-SLAVE.

Message number 8, NO-MESSAGE/NO-REPLY, is a message sent by either controller to the other to validate that no message (or reply, as the case may warrant) is being sent in the respective control or reply mailbox to which the NO-MESSAGE/NO-REPLY is written. For example, this messaging is to be sure that the reply mailbox is communicating a "valid" message of "nothing" or "null" (i.e., NO-REPLY) when a control message is sent to the control mailbox. Likewise, it is to be sure that the control mailbox is communicating a "valid" message of "nothing" or "null" (i.e., NO-MESSAGE) when a reply message is sent to the reply mailbox. Moreover, NO-MESSAGE/NO-REPLY is sent to communicate that no other message is being transmitted or expected at the present time. As a more particular example, when a requesting controller writes a message (such as ARE-YOU-ACTIVE) into its own control mailbox, it also writes a NO-REPLY message into its own reply mailbox so that the other controller knows that this is a control message being sent and not some erroneous reply message being sent.

Each of these examples shows how a tightly coupled communication protocol is followed between the controllers for monitoring and coordinating their activities. Each request and reply message is very specific and unambiguous, and each "null" message is specific and unambiguous so that express communication is absolutely understood, and implied communication occurs from a lack of express communication detected by the tightly coupled protocol.

Figure 3:
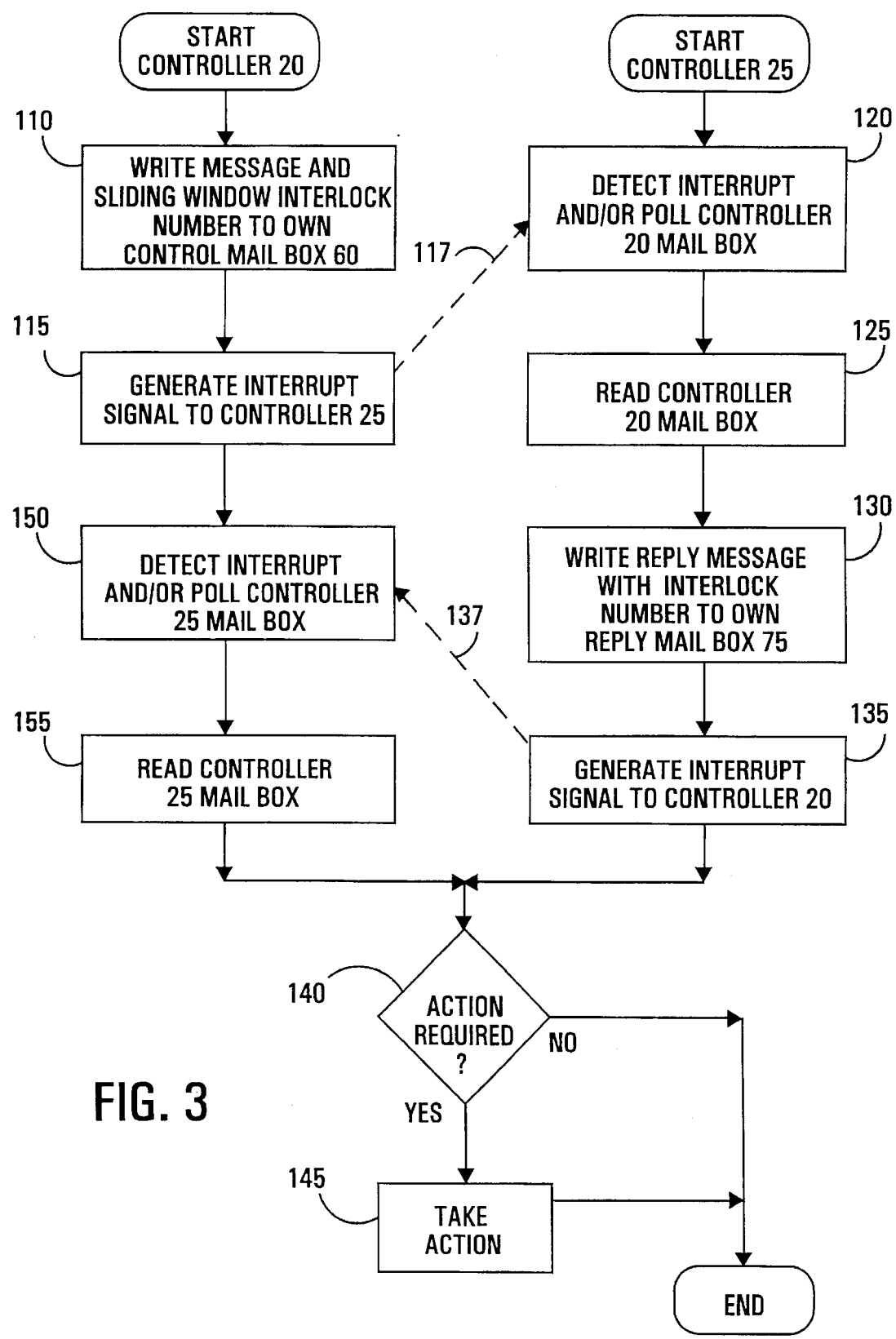
FIG. 3 is a flow chart depicting the steps followed in an exemplary communication between mirrored memory controllers according to the present invention system and method.

Referring now to FIG. 3, a flow chart is shown depicting steps followed in an exemplary communication between mirrored memory controllers 20 and 25 (of FIG. 1) according to the present invention system and method. A separate flow path exists for each controller because each controller is an independent entity and communicates with the other controller pursuant to independent processing.

The first step in using mirrored memory as a robust communication path between dual controllers 20 and 25 is for one of the controllers to initiate communication by writing a message to its own control mailbox. Accordingly, at 110, controller 20 writes a request message to control mailbox 60 of its own general mailbox 40 (of FIG. 1). Controller 20 writes the message to its own mailbox and not to controller 25's mailbox by disabling mirroring. When writing a message, each controller follows the tightly coupled communication protocol discussed in FIG. 2 to insure that specific, unambiguous requests and replies are used in the communication process. Along with the message, controller 20 writes a sliding window interlock identification number. Controller 20 may also need to set NO-REPLY in its reply box (depending upon the reply box's last state) in order to prevent unintentional implied messages. Subsequently, 115, controller 20 generates an interrupt signal to controller 25 to indicate that a message is in the mailbox. Dashed directional arrow 117 depicts the interrupt signal from controller 20 to controller 25.

Controller 25 then detects the interrupt signal and reads the request message and the identification number in controller 20's mailbox, steps 120 and 125. In the event a failure occurred such that controller 25 did not detect the interrupt signal, controller 25 would still read controller 20's mailbox by polling to detect a message upon a scheduled timer interval, 120. Each controller retains its own clock and polls the other controller's mailbox upon the scheduled timer interval of 16.4 seconds (in the preferred embodiment) to detect whether a message exists or not. This dual means of detecting whether a message exists, i.e., interrupt and polling, provides enhanced reliability to the communication process and system.

After detecting and reading the message, controller 25 then responds 130 by writing an appropriate reply message to its own reply mailbox (75 of FIG. 1). Controller 25 also writes the same identification number that it read from controller 20's control mailbox into its own reply mailbox to conform to the sliding window interlock scheme. Controller 25 may also need to set NO-MESSAGE in its control box (depending upon the control box's last state) in order to prevent unintentional implied messages. Next, 135, controller 25 generates an interrupt to controller 20 indicating that a message is in the mailbox for controller 20 to read. Dashed directional arrow 137 depicts the interrupt signal from controller 25 to controller 20.

At this point, 140, controller 25 determines whether it must take any responsive action based upon the request sent by controller 20 and, if so, take action accordingly 145. For example, if the request sent by controller 20 was a TAKE-OVER message (see FIG. 2), controller 25 would then takeover as the new Master controller.

Substantially concurrently with any action controller 25 may take, controller 20 detects the interrupt signal and reads the reply message and the identification number in controller 25's mailbox, steps 150 and 155. Controller 20 then verifies that the identification number is the same as previously sent to controller 25 to ascertain that the reply message is in fact the appropriate reply to the request message that controller 20 originally sent. If the identification number is valid, controller 20 responds by determining if any action is required 140 and taking appropriate action 145 if so required. In the event the identification number is invalid, controller 20 would likewise take appropriate action 140 and 145 based on the set of circumstances. As previously discussed in reference to FIG. 1, standard operating procedures define appropriate measures to be taken in circumstances such as an invalid number, or where an implied message is read due to a communication failure.

This example communication of FIG. 3 depicts only one direction of a full duplex path. Simultaneously, controller 25 could be sending a control message to controller 20 and controller 20 replying to that message.

In summary, and in reference to all figures, the present invention system uses mirrored memory 30 and 35 as a robust communication path between dual controllers 20 and 25 by:

1) keeping the memories synchronized and consistent in real time by using mirrored memory constructs in conjunction with communicating therebetween by means of messaging mailboxes 40 and 45 and a tightly coupled communication protocol;

2) resolving address decoding and data bit problems between memories by having one of the controllers test its lines upon power up and then using the tightly coupled communication protocol and implied messages to detect address and data bit problems with either controller during communication therebetween;

3) synchronizing messages between the controllers by means of messaging mailboxes, a tightly coupled communication protocol, interrupt signals, and independent timer detection intervals;

4) protecting each mirrored memory from corruption resulting from the communication process between the controllers by having each controller write only to its own mailbox and not to the other controller's mailbox for messaging purposes and having each controller only read the other controller's mailbox;

5) managing the consistency of the mirrored memory by continually monitoring and verifying communications between the controllers by means of the mailboxes and communication protocol;

6) managing a communication process error or total communication break down between the controllers by detecting and responding to express and implied communications and using standard operating procedures;

7) managing hardware failures by detecting and responding to appropriate express or implied communication messages and by using standard operating procedures.

What has been described above are the preferred embodiments for a system and method for using mirrored memory as a robust communication path between dual disk storage controllers. It is clear that the present invention offers a powerful tool for providing a cost effective, real-time link between controllers, and allows each controller to monitor the state of the other, and allows each controllers' activities to be coordinated. Moreover, it will be obvious to one of ordinary skill in the art that the present invention is easily implemented utilizing any of a variety of hardware platforms and software tools existing in the art. While the present invention has been described by reference lo to specific embodiments, it will be obvious that other alternative embodiments and methods of implementation or modification may be employed without departing from the true spirit and scope of the invention.

What is claimed is:

1. A communication and control system for a computer disk storage system, comprising:
   (a) a plurality of disk storage controllers, each controller having substantially mirrored memory with respect to each other;
   (b) a messaging mailbox in the mirrored memory of each controller, wherein the messaging mailbox is a reserved portion of the memory;
   (c) means for communicating a message through the mailbox by selectively controlling mirroring of the mailbox, including means for selectively enabling and disabling mirroring (i) upon an event of one of the controllers writing to its own mailbox to reduce collateral error to each of the of the other controllers' memory, and (ii) upon an event of reading one of the other controllers' mailbox; and,
   (d) means for detecting and reading the message in the mailbox.

2. The system according to claim 1 wherein the messaging mailbox is read and written by the controller on which the mailbox resides but only read by the other controllers.

3. The system according to claim 1 wherein the means for communicating a message includes a tightly coupled communication protocol between the controllers.

4. The system according to claim 3 wherein the protocol includes, for each message, a specific, unambiguous response to a specific, unambiguous request, and wherein the protocol further includes a specific, unambiguous null message to validate communication.

5. The system according to claim 1 wherein the means for communicating a message further includes means for generating an interrupt signal to notify an intended message recipient controller of the existence of the message.

6. The system according to claim 1 wherein the means for communicating a message further includes a sliding window interlock identification number associated with the message to insure message detection and one to one message correctness.

7. The system according to claim 1 wherein the means for detecting the message includes an interrupt signal detection means.

8. The system according to claim 1 wherein the means for detecting the message further includes a timer based polling detection means.

9. The system according to claim 1 wherein the means for detecting the message further includes detecting one of the message and an implied message, the implied message being a result of a detection of a set of circumstances relating to at least one of the controllers.

10. The system according to claim 1 wherein the means for detecting the message further includes a means for detecting a sliding window interlock identification number associated with the message.

11. A system for using mirrored memory as a communication path between mirrored memory controllers in a dual controller disk storage system, the system comprising:
   (a) a messaging mailbox in a reserved portion of the memory of each controller, the mailbox being a portion of memory wherein mirroring is selectively controlled, and wherein the mailbox is read and written by the controller on which the mailbox resides but only read by the other controller;
   (b) a tightly coupled communication protocol between the controllers for communicating a message through each mailbox, the protocol including for each message, a specific, unambiguous response to a specific, unambiguous request, and further including a validating null message;
   (c) means for communicating and detecting the message in each mailbox, including:
      (i) interrupt means for signaling and detecting the message;
      (ii) timer based polling means for detecting the message; and,
      (iii) sliding window interlock means associated with each message for insuring message detection and one to one message correctness; and,
   (d) means for acting upon the message in accordance with a request in the message, including means for acting upon an implied message detected in response to a set of circumstances relating to at least one of the controllers.

12. A method of using mirrored memory as a communication path between mirrored memory controllers in a dual controller disk storage system, the method comprising the steps of:
   (a) communicating a message through a reserved mailbox portion of the mirrored memory wherein mirroring is selectively controlled;
   (b) detecting the message in the mailbox, including each of the controllers polling the mailbox of the other controllers upon a timer based interval, and wherein the polling includes detecting one of the message and an implied message, the implied message being a result of a detection of a set of circumstances relating to at least one of the controllers; and,
   (c) responding to the message in the mailbox.

13. The method of claim 12 wherein the step of communicating includes reading and writing the mailbox by the controller on which the mailbox resides but only reading by the other controller.

14. The method of claim 12 wherein the step of communicating further includes following a tightly coupled communication protocol with the message between the controllers, and wherein the protocol includes, for each message, a specific, unambiguous response to a specific, unambiguous request, and further includes a validating null message.

15. The method of claim 12 wherein the step of communicating further includes:
   (a) sending a sliding window interlock number in association with the message; and, (b) sending an interrupt signal from one of the controllers on which the message resides to the other controller to notify of the existence of the message.

16. The method of claim 12 wherein the step of detecting the message includes:
   (a) detecting an interrupt signal by one of the controllers for which the message is intended, the interrupt being generated from the other controller indicating the message is ready to be read; and,
   (b) detecting an appropriate sliding window interlock number in association with the message, the detecting being performed by one of the controllers for which the message is intended.

17. The method of claim 12 wherein the step of responding to the message includes responding in a manner selected from the group consisting of:
   (a) responding in accordance with a request in the message;
   (b) responding to an implied message detected in response to a set of circumstances relating to at least one of the controllers; and,
   (c) acting upon one of the message and an implied message according to a predefined set of rules.

* * * * *